(12) United States Patent
Lee et al.

(10) Patent No.: US 10,255,959 B2
(45) Date of Patent: Apr. 9, 2019

(54) MEMORY DEVICES CONFIGURED TO PREVENT READ FAILURE DUE TO LEAKAGE CURRENT INTO BIT LINE

(71) Applicant: Samsung Electronics Co., Ltd., Suwon-si, Gyeonggi-do (KR)

(72) Inventors: Kyung Min Lee, Seoul (KR); Hyemin Shin, Suwon-si (KR); Jung Hyuk Lee, Hwaseong-si (KR); Hyunsung Jung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/946,055

(22) Filed: Apr. 5, 2018

(65) Prior Publication Data

US 2019/0066748 A1 Feb. 28, 2019

(30) Foreign Application Priority Data

Aug. 24, 2017 (KR) .................. 10-2017-0107482

(51) Int. Cl.
| | |
|---|---|
| G11C 11/00 | (2006.01) |
| G11C 11/16 | (2006.01) |
| H01L 23/528 | (2006.01) |
| H01L 27/22 | (2006.01) |
| H01L 43/08 | (2006.01) |
| G11C 29/42 | (2006.01) |
| H01F 10/32 | (2006.01) |

(52) U.S. Cl.
CPC ........ *G11C 11/1673* (2013.01); *G11C 11/161* (2013.01); *G11C 11/1655* (2013.01); *G11C 11/1675* (2013.01); *G11C 11/1697* (2013.01); *G11C 29/42* (2013.01); *H01F 10/329* (2013.01); *H01F 10/3254* (2013.01); *H01L 23/528* (2013.01); *H01L 27/228* (2013.01); *H01L 43/08* (2013.01)

(58) Field of Classification Search
CPC .............. G11C 11/1673; G11C 11/161; G11C 11/1655; G11C 11/1675; G11C 11/1697; G11C 29/42
USPC ......... 365/158, 189.15, 189.16, 189.09, 148, 365/171, 173
See application file for complete search history.

(56) References Cited

U.S. PATENT DOCUMENTS

| | | |
|---|---|---|
| 7,164,604 B2 | 1/2007 | Arakawa |
| 7,813,166 B2 | 10/2010 | Jung et al. |

(Continued)

FOREIGN PATENT DOCUMENTS

KR       10-2012-0091583        8/2012

*Primary Examiner* — Gene N Auduong
(74) *Attorney, Agent, or Firm* — Myers Bigel, P.A.

(57) ABSTRACT

A memory device may include a selected bit line connected to a first node and configured to receive a first current, a selected memory cell connected to the selected bit line, a reference bit line connected to a second node and configured to receive a second current, a reference memory cell connected between the reference bit line and a reference source line, a sub bit line connected to the second node, a sub memory cell connected between the sub bit line and a sub source line, and a sense amplifier configured to sense a voltage difference between the first node and the second node to determine data read from a selected memory cell connected to the selected bit line. The sub memory cell may include a cell transistor. A gate electrode of the cell transistor may be connected to the sub source line.

20 Claims, 16 Drawing Sheets

(56) References Cited

U.S. PATENT DOCUMENTS

| | | | |
|---|---|---|---|
| 7,920,417 B2 | 4/2011 | Seo et al. | |
| 8,064,264 B2 * | 11/2011 | Shinozaki | G11C 16/26 |
| | | | 365/185.18 |
| 8,130,582 B2 * | 3/2012 | Shimano | G11C 8/04 |
| | | | 365/189.011 |
| 8,649,207 B2 | 2/2014 | Ramani et al. | |
| 8,687,412 B2 | 4/2014 | Chih et al. | |
| 8,902,641 B2 | 12/2014 | Chih et al. | |
| 8,917,536 B2 | 12/2014 | Jan et al. | |
| 8,923,040 B2 | 12/2014 | Lin et al. | |
| 9,311,997 B2 * | 4/2016 | Lee | G11C 29/50008 |
| 9,666,243 B2 | 5/2017 | Levisse | |

* cited by examiner

MEMORY DEVICES CONFIGURED TO PREVENT READ FAILURE DUE TO LEAKAGE CURRENT INTO BIT LINE

CROSS-REFERENCE TO RELATED APPLICATION

The present application claims priority under 35 U.S.C. § 119 to Korean Patent Application No. 10-2017-0107482, filed on Aug. 24, 2017 in the Korean Intellectual Property Office, the entire contents of which are hereby incorporated herein in their entirety by reference.

BACKGROUND

Embodiments of the inventive concepts relate to memory devices, and more particularly, to memory devices configured to prevent read failure.

Semiconductor memory devices may be generally classified as volatile memory devices or nonvolatile memory devices. Read and write speeds of the volatile memory devices may be fast, but data stored therein may disappear when a power supply is interrupted. In contrast, the nonvolatile memory devices may retain data stored therein even though external the power supply is interrupted. Therefore, the nonvolatile memory devices may be used to store information to be retained regardless of whether power is supplied.

Demand for nonvolatile semiconductor memory devices capable of implementing high integration and large capacity is increasing. An example of nonvolatile semiconductor memory devices is flash memory used in portable electronic devices. However, some nonvolatile elements may be randomly accessible and may have improved performance. For example, ferroelectric RAM (FRAM) devices may use ferroelectric capacitors, magnetic RAM (MRAM) devices may use tunneling magneto-resistive (TMR) layers, phase change RAM (PRAM) devices may use chalcogenide alloys, resistive RAM (RRAM) devices may use variable resistance layers as a data storage medium, etc.

The above-described nonvolatile memories, in particular the MRAM, may include a reference cell for determining data stored in memory cells, in addition to a memory cell in which data is stored. However, a voltage (or resistance) distribution of memory cells in which data is stored may vary due to various causes, such as the number of unselected memory cells and a peripheral temperature. If a level of a reference voltage used to perform a read operation is not corrected even though the voltage distribution of memory cells varies due to the causes, serious read failure may be caused. Therefore, it may be important to prevent the read failure through correction of the reference voltage.

SUMMARY

Embodiments of the inventive concepts may provide a configuration of a reference bit line and an operating method which are capable of preventing read failure due to a leakage current into a bit line.

According to some embodiments of the inventive concepts, memory devices may be provided. A memory device may include a selected bit line connected to a first node and configured to receive a first current, a selected memory cell connected to the selected bit line, a reference bit line connected to a second node and configured to receive a second current, a reference memory cell connected between the reference bit line and a reference source line, a sub bit line connected to the second node, a sub memory cell connected between the sub bit line and a sub source line, and a sense amplifier configured to sense a voltage difference between the first node and the second node to determine data read from a selected memory cell connected to the selected bit line. The sub memory cell may include a cell transistor. A gate electrode of the cell transistor may be connected to the sub source line.

According to some embodiments of the inventive concepts, memory devices may be provided. A memory device may include a memory cell array including a selected memory cell connected to a selected bit line, a reference cell connected to a reference bit line, and a sub cell connected to a sub bit line, a first node configured to provide a first current to the selected bit line, a second node configured to provide a second current to the reference bit line and the sub bit line, and a sense amplifier configured to sense a voltage difference between the first node and the second node. The sub cell may include a magnetic tunnel junction element having a first end connected to the sub bit line, and a cell transistor having a first end connected to a second end of the magnetic tunnel junction element, a second end connected to a sub source line, and a gate electrode connected to the sub source line.

According to some embodiments of the inventive concepts, memory devices may be provided. A memory device may include a memory cell array that includes a selected memory cell connected to a selected bit line, a reference cell connected to a reference bit line, a first sub cell connected to a first sub bit line, and a second sub cell connected to a second sub bit line, a first node configured to provide a first current to the selected bit line, a second node configured to provide a second current to the reference bit line, the first sub bit line, and the second sub bit line, a sense amplifier configured to sense a voltage difference between the first node and the second node, and control logic that is configured to selectively connect the first sub bit line and the second sub bit line to the second node.

BRIEF DESCRIPTION OF THE FIGURES

The above and other objects and features will become more apparent from the following description with reference to the accompanying drawings. Like reference numerals may refer to like parts throughout the various figures unless otherwise specified.

DETAILED DESCRIPTION

Figure 1:
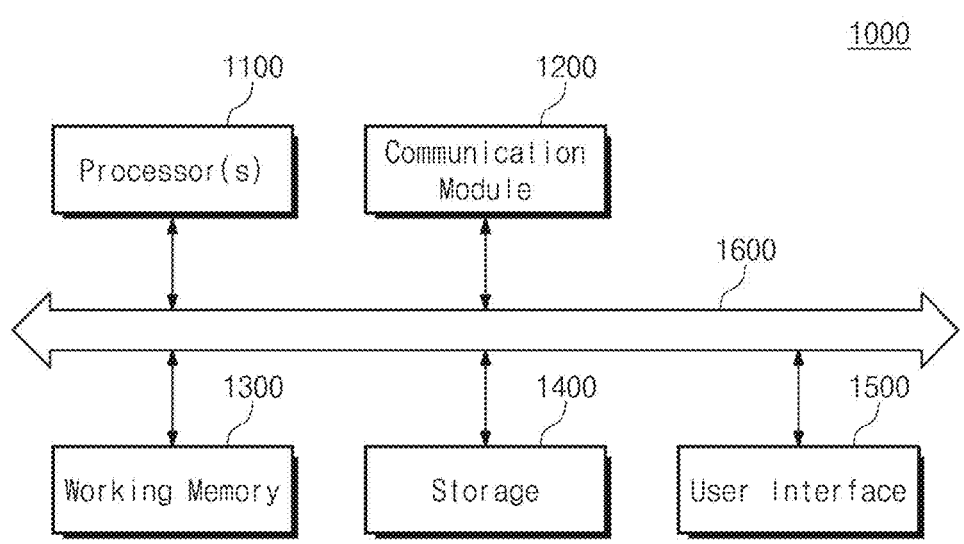
FIG. 1 is a block diagram illustrating an electronic system including storage according to some embodiments of the inventive concepts.

FIG. 1 is a block diagram illustrating an electronic system including storage according to some embodiments of the inventive concepts.

Referring to FIG. 1, an electronic system 1000 may include at least one processor 1100, a communication module 1200, a working memory 1300, storage 1400, a user interface 1500, and a bus 1600. For example, the electronic system 1000 may be an electronic device such as a desktop computer, a laptop computer, a tablet computer, a smartphone, a wearable device, a video game console, a workstation, a server, and an electric vehicle.

The processor 1100 may control overall operations of the electronic system 1000. The processor 1100 may process various kinds of arithmetic operations and/or logical operations. To this end, the processor 1100 may include an application specific integrated circuit (ASIC), a field-programmable gate array (FPGA), a dedicated microprocessor, a microprocessor, etc. For example, the processor 1100 may include one or more processor cores and may be implemented with a general-purpose processor, a special-purpose processor, and/or an application processor. As used herein, the term "and/or" includes any and all combinations of one or more of the associated listed items.

The communication module 1200 may communicate with an external device/system of the electronic system 1000. For example, the communication module 1200 may be an intellectual property (or a function block), a circuit, or a semiconductor chip manufactured independently of the processor 1100. Alternatively or additionally, if the processor 1100 is implemented with an application processor, a function of at least a part of the communication module 1200 may be merged in the application processor 1100.

For example, the communication module 1200 may support at least one of various wireless communication protocols such as long term evolution (LTE), worldwide interoperability for microwave access (WiMax), global system for mobile communication (GSM), code division multiple access (CDMA), Bluetooth, near field communication (NFC), wireless fidelity (Wi-Fi), and radio frequency identification (RFID) and/or at least one of various wired communication protocols such as transfer control protocol/Internet protocol (TCP/IP), universal serial bus (USB), and Firewire.

The working memory 1300 may store data to be used in an operation of the electronic system 1000. For example, the working memory 1300 may temporarily store data that is processed or will be processed by the processor 1100. For example, the working memory 1300 may include a volatile memory, such as a dynamic random access memory (DRAM) or a synchronous DRAM (SDRAM), and/or a nonvolatile memory, such as a phase-change RAM (PRAM), a magneto-resistive RAM (MRAM), a resistive RAM (ReRAM), or a ferro-electric RAM (FRAM). In some embodiments, the working memory 1300 may have a combination of various volatile and/or nonvolatile memory devices.

The storage 1400 may include one or more memory devices and a controller. The memory devices of the storage 1400 may retain data regardless of power supply. For example, the storage 1400 may include a nonvolatile memory device such as a flash memory, a PRAM, a MRAM, a ReRAM, or a FRAM. For example, the storage 1400 may include a storage medium such as a solid state drive (SSD), removable storage, or embedded storage.

The user interface 1500 may perform communication mediation between a user and the electronic system 1000. For example, the user interface 1500 may include input interfaces such as a keyboard, a mouse, a keypad, a button, a touch panel, a touch screen, a touch pad, a touch ball, a camera, a microphone, a gyroscope sensor, and a vibration sensor. For example, the user interface 1500 may include output interfaces such as a liquid crystal display (LCD) device, a light emitting diode (LED) display device, an organic LED (OLED) display device, an active matrix OLED (AMOLED) display device, a speaker, and a motor.

The bus 1600 may provide a communication path between the components of the electronic system 1000. The components of the electronic system 1000 may exchange data with each other based on a bus format of the bus 1600. For example, the bus format may include one or more of various interface protocols such as USB, small computer system interface (SCSI), peripheral component interconnect express (PCIe), mobile PCIe (M-PCIe), advanced technology attachment (ATA), parallel ATA (PATA), serial ATA (SATA), serial attached SCSI (SAS), integrated drive electronics (IDE), enhanced IDE (EIDE), nonvolatile memory express (NVMe), and universal flash storage (UFS).

The working memory 1300 and the storage 1400 may include a memory device implemented to generate a leakage current for securing read margin. For example, in a read operation using a bit line associated with a lot of unselected word lines or in a high-temperature read operation, a sub bit line into which a part of a read current input to a reference node is leaked may be additionally provided to prevent the read margin from being reduced according to a change in a voltage distribution. Besides, there are various configurations and operations for securing the read margin, and specific embodiments will be described with reference to FIGS. 2 to 18.

Figure 2:
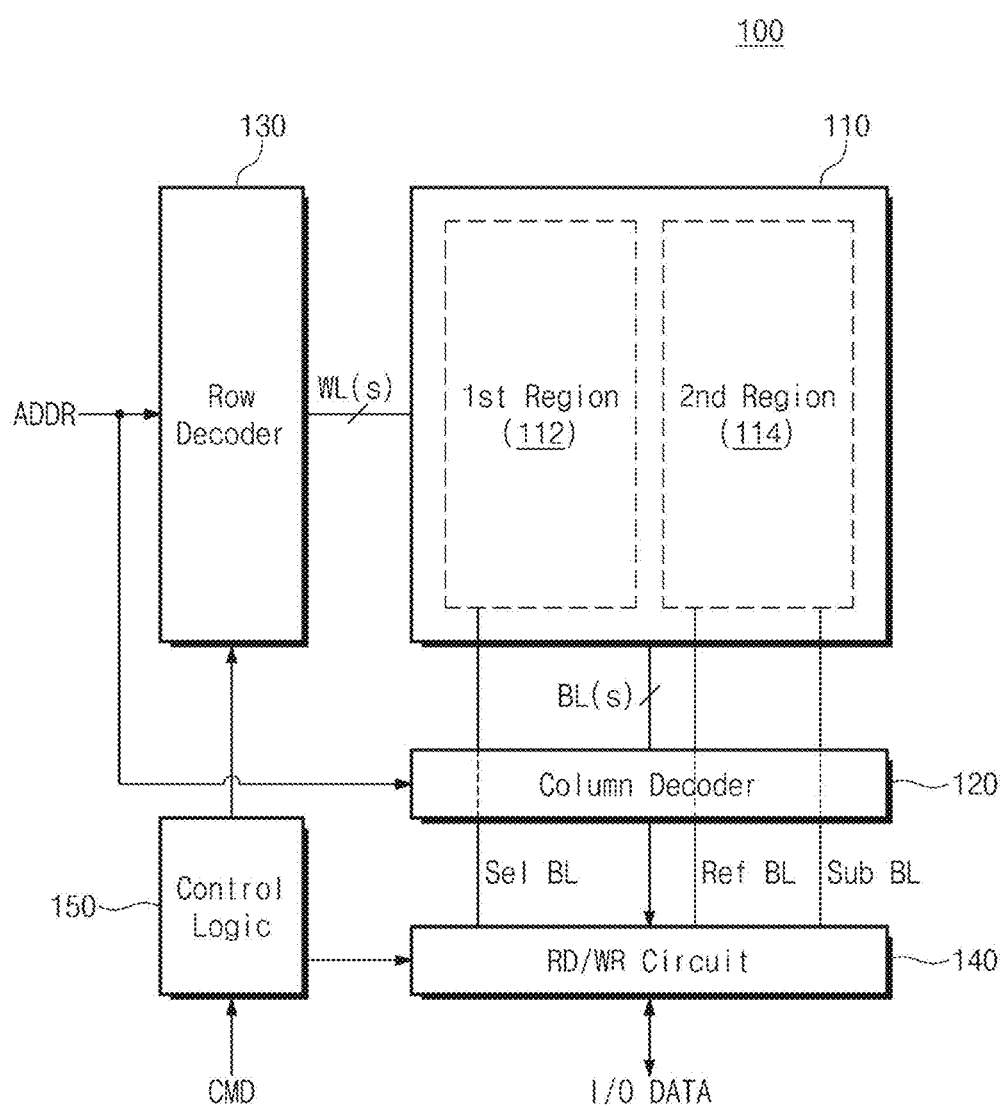
FIG. 2 is a block diagram illustrating a memory device according to some embodiments of the inventive concepts.

FIG. 2 is a block diagram illustrating a memory device according to some embodiments of the inventive concepts. For example, a memory device 100 may be implemented in the working memory 1300 and/or the storage 1400 of the electronic system 1000 of FIG. 1. The memory device 100 may include a memory cell array 110, a column decoder 120, a row decoder 130, a read/write circuit 140, and control logic 150.

The memory device 100 may generate a reference voltage by using a reference cell. The memory device 100 may compare a voltage of a selected bit line connected to a selected memory cell with the reference voltage. The memory device 100 may be configured to decrease a level of the reference voltage in consideration of a leakage current into an unselected memory cell except for the selected memory cell. For example, the memory device 100 may include a sub bit line for replicating a leakage current into unselected memory cells of the selected bit line.

It will be understood that when an element is referred to as being "connected" to, "coupled" to, or "on" another element, it may be directly connected to, coupled to, or on the other element or intervening elements may be present. In contrast, the term "directly" means that there are no intervening elements.

The memory cell array 110 may include a plurality of memory cells implemented using variable resistance memory cells. For example, the memory cells of the memory cell array 110 may include spin transfer torque magneto resistive RAM (STT-MRAM) cells. A STT-MRAM cell may include a magnetic tunnel junction (MTJ) element having a magnetic material. The memory cells and the memory cell array 110 will be described with reference to FIGS. 4 to 7.

The memory cell array 110 may include a first region 112 and a second region 114. The first region 112 may be a region in which data is stored. The second region 114 may be a region associated with the reference voltage needed to read the data stored in the first region 112. The first region 112 and the second region 114 may have the same structure or substantially the same or similar structures. That is, the first region 112 and the second region 114 may be formed using the same manufacturing process.

It will be understood that, although the terms "first," "second," etc. may be used herein to describe various elements, these elements should not be limited by these terms. These terms are only used to distinguish one element from another. Thus, a first element could be termed a second element without departing from the teachings of the present inventive concepts.

Locations of the first region 112 and the second region 114 may be fixed in the memory cell array 110. Alternatively or additionally, locations of the first region 112 and the second region 114 may be flexibly set in the memory cell array 110 (e.g., by a controller or the like).

The column decoder 120 and the row decoder 130 may decode a column address and a row address of a received address, respectively. The column decoder 120 and the row decoder 130 may select a bit line BL and a word line WL connected to a memory cell, on which a read or write operation is performed, based on the column address and the row address.

The read/write circuit 140 may sense data of selected memory cells during a read operation. For example, during the read operation, the read/write circuit 140 may compare a voltage of a bit line to which a selected memory cell is connected, with a reference voltage of a reference bit line Ref BL to which reference cells are connected. For example, the read/write circuit 140 may include a sense amplifier for amplifying the comparison result by the read/write circuit 140. The read/write circuit 140 may latch the comparison result by the read/write circuit 140.

The control logic 150 may control the read/write circuit 140 in response to a command CMD. For example, the control logic 150 may perform various operations for decreasing a voltage level of the reference bit line Ref BL to improve read margin during the read operation. For example, the control logic 150 may select a sub bit line into which a leakage current for decreasing a voltage of the reference bit line Ref BL flows. Alternatively or additionally, the control logic 150 may perform gate biasing/body biasing on a sub cell connected to the sub bit line, which will be more fully described with reference to FIG. 8.

The memory device 100 may further include an error correction circuit. The error correction circuit may perform error detection and correction on read data provided from the read/write circuit 140. For example, the error correction circuit may perform encoding and decoding of a hamming code manner capable of correcting a single error and detecting a double error.

The error correction circuit may decode the read data provided from the read/write circuit 140 to detect existence of an error. The error correction circuit corrects a correctable error. When an error does not exist or a correctable error is included in the read data, the error correction circuit may transfer a flag representing read pass to the control logic 150. In contrast, when an uncorrectable error is detected upon decoding the read data, the error correction circuit may transfer a flag representing read fail to the control logic 150.

For example, when an error of the read data is uncorrectable, the control logic 150 may perform various operations for decreasing a level of a reference voltage of the reference bit line Ref BL. For example, the control logic 150 may perform the gate biasing/body biasing on a cell transistor connected to the sub bit line Sub BL. For example, when a plurality of sub bit lines are provided, the control logic 150 may determine the optimal number of sub bit lines capable of securing the read margin.

Figure 3:
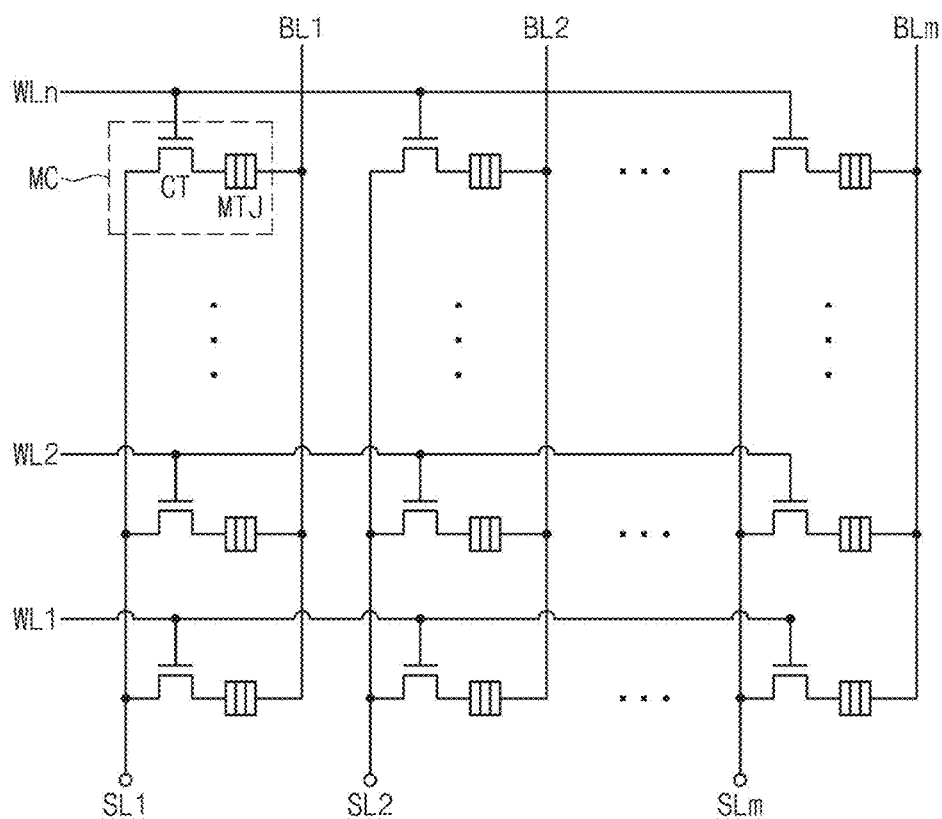
FIG. 3 is a circuit diagram illustrating the first region of the memory cell array of FIG. 2 according to some embodiments of the inventive concepts.

FIG. 3 is a circuit diagram illustrating the first region of the memory cell array of FIG. 2 according to some embodiments of the inventive concepts. The memory cell array 112 may include a plurality of memory cells MC arranged along row and column directions. Each memory cell MC may include an MTJ element and a cell transistor CT. In some embodiments, the memory cell MC may refer to only the MTJ element.

A resistance value of an MTJ element may vary depending on the magnitude and direction of a current (or voltage) provided to the MTJ element. The resistance value of the MTJ element may be maintained without change even though a current (or voltage) provided to the MTJ element is blocked. That is, the MTJ element may have a nonvolatile characteristic.

Gate electrodes of the cell transistors CT may be connected to word lines WL1 to WLn, respectively. Each cell transistor CT may be switched on or switched off by a signal provided through a word line corresponding thereto. A drain electrode of each cell transistor CT may be connected to the MTJ element, and a source electrode thereof may be connected to a relevant source line SL. For example, the source electrodes of the cell transistors CT may be connected to the same source line. Alternatively or additionally, only at least a part of the source electrodes of the cell transistors CT may be connected to the same source line.

Figure 4:
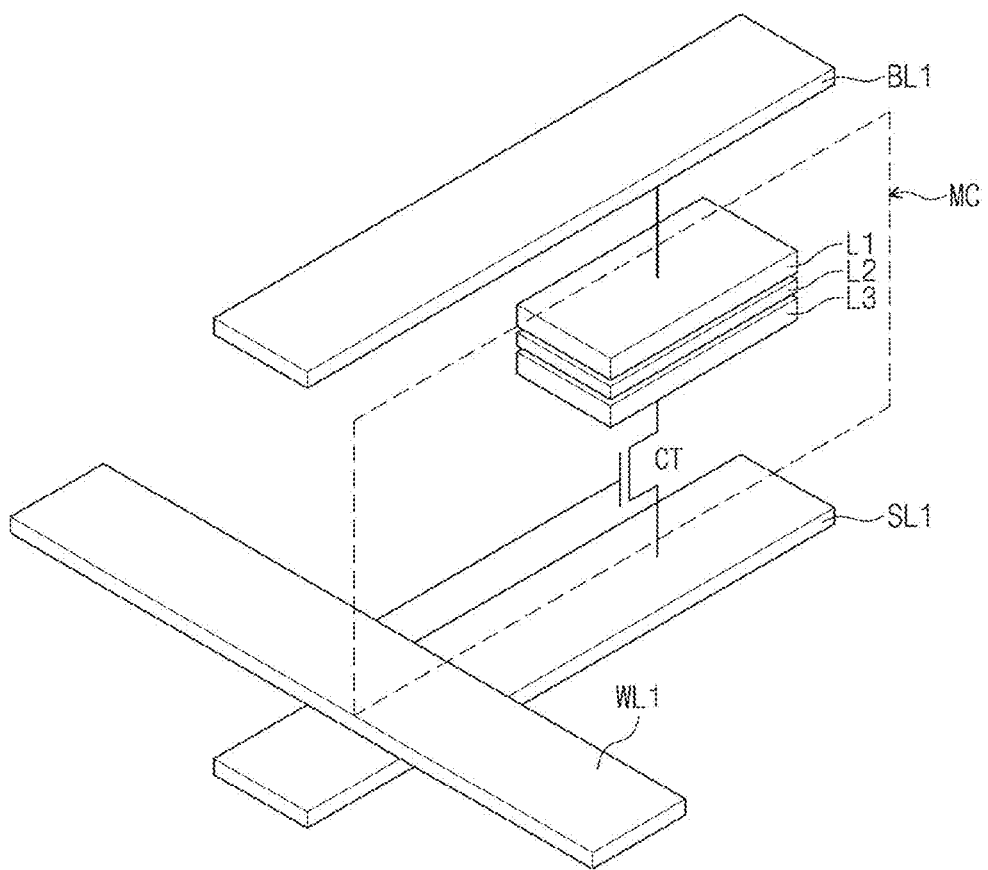
FIG. 4 is a perspective view schematically illustrating some embodiments of a memory cell included in the memory cell array of FIG. 2 according to some embodiments of the inventive concepts.

FIG. 4 is a perspective view schematically illustrating some embodiments of a memory cell included in the memory cell array of FIG. 2 according to some embodiments of the inventive concepts. Referring to FIGS. 2-4, the memory cell MC may include the magnetic tunnel junction element MTJ (L1 to L3) and the cell transistor CT.

A gate electrode of the cell transistor CT may be connected to a word line (e.g., a first word line WL1), and a first end of the cell transistor CT may be connected to a bit line (e.g., a first bit line BL1) through the magnetic tunnel junction element MTJ. A second end of the cell transistor CT may be connected to a source line (e.g., a first source line SL1).

The magnetic tunnel junction element MTJ may include a pinned layer L3, a free layer L1, and a barrier layer L2. A magnetization direction of the pinned layer L3 may be pinned, and a magnetization direction of the free layer L1 may be the same as or opposite to the magnetization direction of the pinned layer L3 depending on a condition. The memory cell MC may further include, for example, an anti-ferromagnetic layer for pinning the magnetization direction of the pinned layer L3.

The free layer L1 may include a material that has a variable magnetization direction. The magnetization direction of the free layer L1 may be changed by an electrical/magnetic factor provided from the outside and/or inside of the memory cell. The free layer L1 may include a ferromagnetic material that contains at least one of cobalt (Co), iron (Fe), and nickel (Ni). For example, the free layer L1 may include at least one of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The barrier layer L2 may have a thickness thinner than a spin diffusion distance. The barrier layer L2 may include a nonmagnetic material. For example, the barrier layer L2 may include at least one of magnesium (Mg), titanium (Ti), aluminum (Al), oxide of magnesium-zinc (MgZn) and magnesium-boron (MgB), and nitride of titanium (Ti) and vanadium (V).

The pinned layer L3 may have a magnetization direction pinned by the anti-ferromagnetic layer. Also, the pinned layer L3 may include a ferromagnetic material. For example, the pinned layer L3 may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The anti-ferromagnetic layer may include an anti-ferromagnetic material. For example, the anti-ferromagnetic layer may include at least one of PtMn, IrMn, MnO, MnS, MnTe, $MnF_2$, $FeCl_2$, FeO, $CoCl_2$, CoO, $NiCl_2$, NiO, and Cr.

During a read operation, a voltage of logical high may be applied to the first word line WL1 connected to the memory cell MC, and thus, the cell transistor CT of the memory cell MC may be turned on. To measure a resistance value of the magnetic tunnel junction element MTJ, a read current may be provided between the first bit line BL1 and the first source line SL1. Data stored in the magnetic tunnel junction element MTJ may be determined based on the measured resistance value.

During a write operation, a voltage of logical high may be applied to the first word line WL1 connected to the memory cell MC, and thus, the cell transistor CT of the memory cell MC may be turned on. To change a resistance value of the magnetic tunnel junction element MTJ, a write current may be provided between the first bit line BL1 and the first source line SL1. The read and write operations associated with the memory cell MC will be more fully described with reference to FIGS. 5 and 6.

Figure 5:
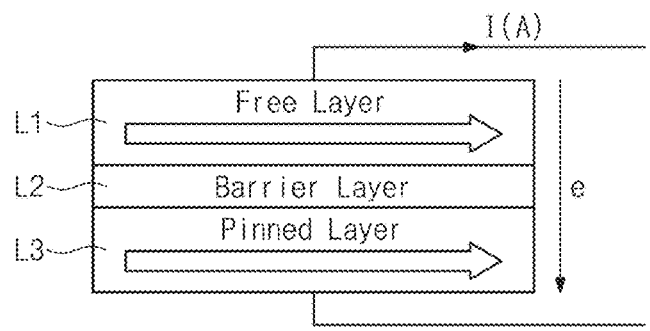
FIGS. 5 and 6 are block diagrams illustrating a magnetization direction of a magnetic tunnel junction (MTJ) element, which is determined according to data stored in the memory cell of FIG. 4, according to some embodiments of the inventive concepts.
Figure 6:
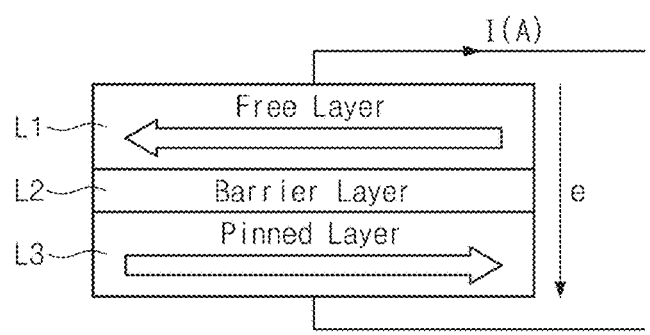

FIGS. 5 and 6 are block diagrams illustrating a magnetization direction of a magnetic tunnel junction (MTJ) element, which is determined according to data stored in the memory cell of FIG. 4, according to some embodiments of the inventive concepts.

Referring to FIGS. 4-6, a resistance value of an MTJ element may vary depending on a magnetization direction of the free layer L1. If a current "I" is provided to the MTJ element, a data voltage corresponding to the resistance value of the MTJ element may be output. Since the intensity of the read current "I" is much smaller than the intensity of a write current, in general, the magnetization direction of the free layer L1 may not change by the read current "I".

Referring to FIG. 5, in the MTJ element, a magnetization direction of the free layer L1 and a magnetization direction of the pinned layer L3 are in parallel with each other. Accordingly, the MTJ element may have a small resistance value. For example, the small resistance value of the MTJ element may correspond to a logical value of "0".

Referring to FIG. 6, in the MTJ element, the magnetization direction of the free layer L1 and the magnetization direction of the pinned layer L3 are anti-parallel. Accordingly, the MTJ element may have a large resistance value. For example, the great resistance value of the MTJ element may correspond to a logical value of "1".

Figure 7:
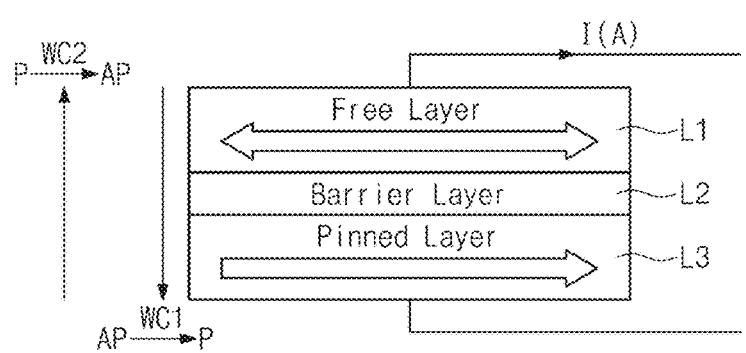
FIG. 7 is a block diagram illustrating a write operation associated with the memory cell of FIG. 4 according to some embodiments of the inventive concepts.

FIG. 7 is a block diagram illustrating a write operation associated with the memory cell of FIG. 4 according to some embodiments of the inventive concepts. Referring to FIG. 7, a magnetization direction of the free layer L1 may be determined according to directions of write currents WC1 and WC2 flowing to the MTJ element. For example, if the first write current WC1 is provided, free electrons having the same spin direction as the pinned layer L3 may provide torque to the free layer L1. As a result, the free layer L1 may be magnetized in parallel "P" with the pinned layer L3.

In contrast, if the second write current WC2 is provided, electrons having a spin opposite to the pinned layer L3 may provide torque to the free layer L1. As a result, the free layer L1 may be magnetized in anti-parallel "AP" with the pinned layer L3. That is, in the MTJ element, the magnetization direction of the free layer L1 may be changed by spin transfer torque (STT).

Figure 8:
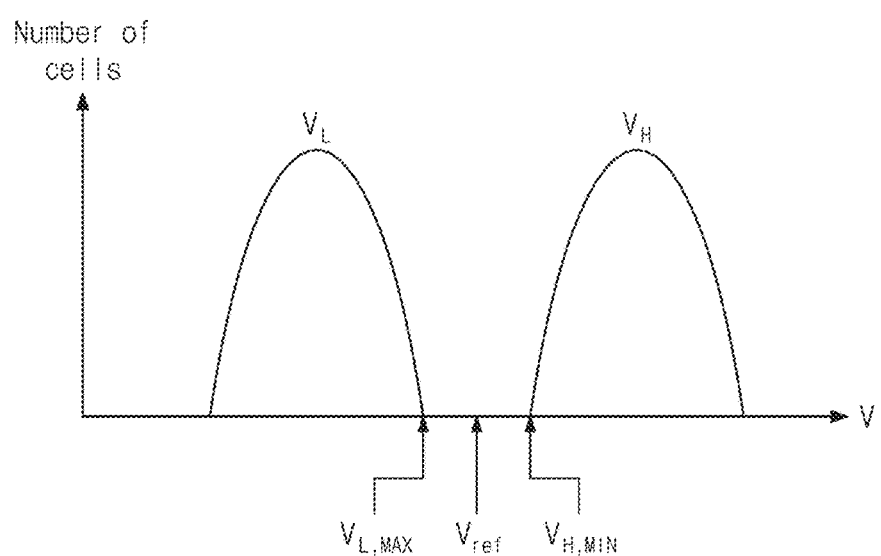
FIG. 8 is a graph illustrating a voltage distribution of the magnetic tunnel junction (MTJ) element of FIGS. 1 to 7 according to some embodiments of the inventive concepts.

FIG. 8 is a graph illustrating a voltage distribution of the magnetic tunnel junction (MTJ) element of FIGS. 1 to 7 according to some embodiments of the inventive concepts. A voltage state of the MTJ element may be classified as a low-voltage state $V_L$ or a high voltage state $V_H$. Here, the voltage means a voltage drop by the MTJ element when a read current is applied to the MTJ element to read data stored in the MTJ element. A reference voltage Vref may be a voltage used to determine whether the MTJ element belongs to the low voltage state $V_L$ or the high voltage state $V_H$.

In the voltage distribution of FIG. 8, the MTJ element belonging to a low voltage ($V_L$) region may mean that programming is performed to have a small resistance value. For example, the low voltage state $V_L$ may correspond to a resistance state of the MTJ element when magnetization directions of a pinned layer and a free layer are the same as each other. In contrast, the MTJ element belonging to a high voltage ($V_H$) region may mean that programming is performed to have a great resistance value. For example, the high voltage state $V_H$ may correspond to a resistance state of the MTJ element when magnetization directions of the pinned layer and the free layer are different from each other.

However, the magnitude of the voltage drop by the MTJ element may decrease due to various causes. If the voltage drop decreases, the overall voltage distribution may be shifted to the left. If a shift of the distribution is great, the smallest value $V_{H,MIN}$ of voltages of MTJ elements distributed in the high voltage ($V_H$) region may be smaller than the reference voltage Vref, which may cause a read fail. According to some embodiments of the inventive concepts, a level of the reference voltage Vref may be adjusted according to a shift of the voltage distribution, thereby preventing the read fail.

Figure 9:
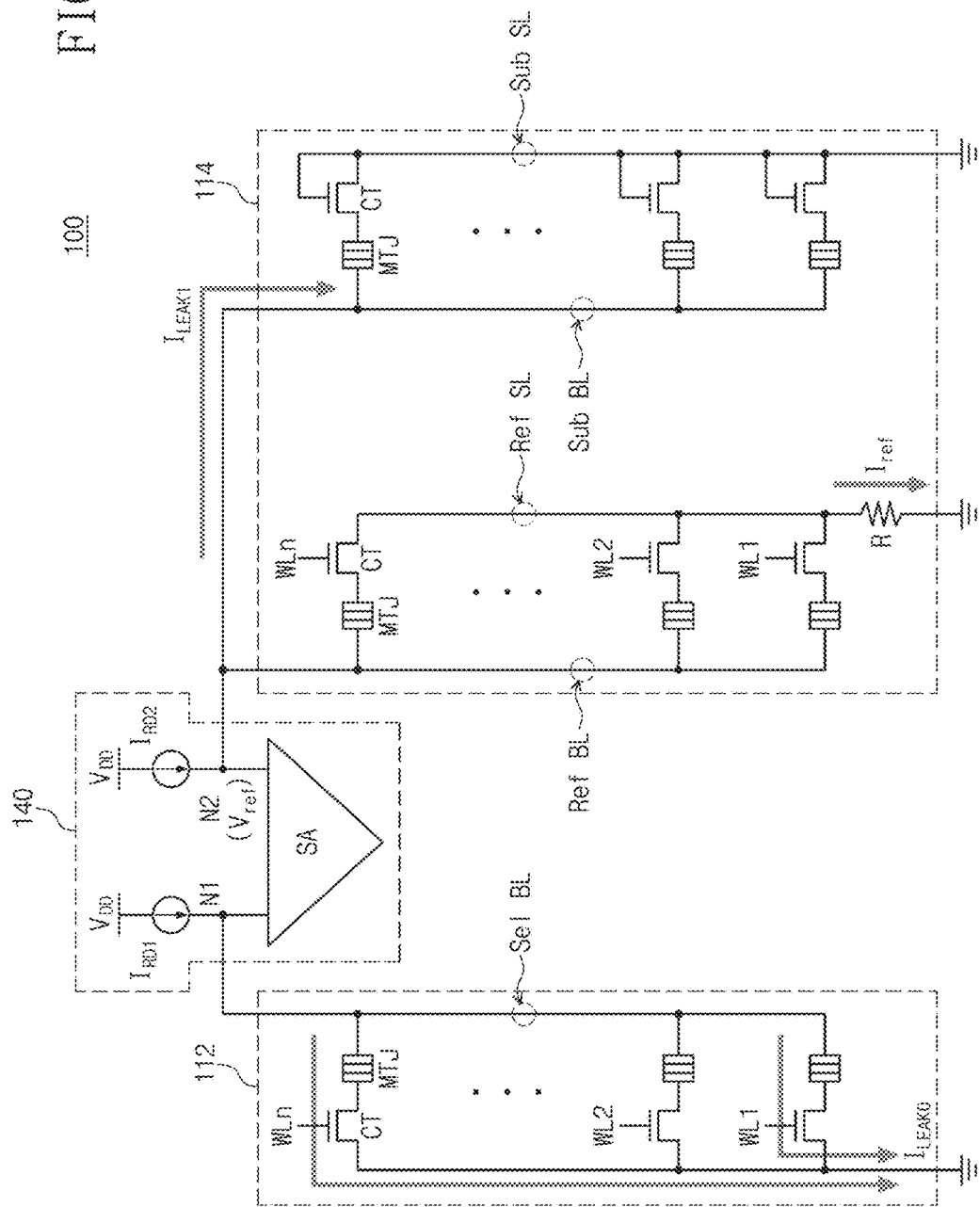
FIG. 9 is a schematic diagram illustrating a memory device according to some embodiments of the inventive concepts.

FIG. 9 is a schematic diagram illustrating a memory device according to some embodiments of the inventive concepts. For brevity of illustration, the memory cell array 110 including the first and second regions 112 and 114 and the read/write circuit 140 among components of the memory device 100 of FIG. 2 are illustrated.

The first region 112 in which data is stored may include memory cells connected to a plurality of bit lines. However, only a selected bit line Sel BL, to which a memory cell to be read is connected, from among a plurality of bit lines of the first region 112 is illustrated. For example, a memory cell connected to a second word line WL2 among memory cells connected to the selected bit line Sel BL may be the selected memory cell to be read and memory cells connected to the remaining word lines WL1 and WL3 to WLn may be unselected memory cells.

The second region 114 may include components needed to generate the reference voltage Vref needed to read data stored in the selected memory cell of the first region 112. For example, the second region 114 may include the reference bit line Ref BL. A structure of the reference bit line Ref BL may be substantially the same as the selected bit line Sel BL. That is, the reference bit line Ref BL and the selected bit line Sel BL may be formed by the same manufacturing process. However the reference bit line Ref BL may further include a resistor "R". For example, the resistor "R" may indicate a resistor that is actually added or may correspond to modeling of resistances of cell transistors CT and MTJ elements connected to the reference bit line Ref BL.

The read/write circuit 140 may be configured to read data stored in the selected memory cell connected to the selected bit line Sel BL. For example, the read/write circuit 140 may include current sources for generating first and second read currents $I_{RD1}$ and $I_{RD2}$ and a sense amplifier SA.

The first read current $I_{RD1}$ may be used to determine a voltage drop in the selected memory cell of the selected bit line Sel BL. For example, the first read current $I_{RD1}$ may be input to a selected word line (i.e., WL2) of the selected bit line Sel BL. The first read current $I_{RD1}$ may be generated based on a first power supply voltage $V_{DD}$. As a result, a voltage drop may occur in the MTJ element connected to the second word line WL2.

The second read current $I_{RD2}$ may be used to determine a voltage drop in elements of the reference bit line Ref BL. For example, the second read current $I_{RD2}$ may be input to the reference bit line Ref BL. The second read current $I_{RD2}$ may be generated based on the first power supply voltage $V_{DD}$. As a result, a voltage drop may occur in the MTJ elements and/or the cell transistors CT connected to the reference bit line Ref BL. In this case, a voltage drop may appear in the resistor "R".

The sense amplifier SA may sense and amplify a voltage difference between a first node N1 and a second node N2. For example, a voltage level of the first node N1 may be higher than a voltage level of the second node N2. The amplified voltage difference may be used to determine data read from a memory cell.

If the sub bit line Sub BL is not provided, read fail may occur in a read operation. For example, a leakage current $I_{LEAK}0$ may flow through unselected word lines WL1 and WL3 to WLn of the selected bit line Sel BL. Since the magnitude of a voltage drop in the MTJ element of the selected word line WL2 decreases due to leakage current $I_{LEAK}0$, a voltage level of the first node N1 may decrease. As a result, since a voltage difference between the first and second nodes N1 and N2 decreases, the sensing margin decreases in the read operation.

However, the memory device 100 according to some embodiments of the inventive concepts may further include the sub bit line Sub BL for replicating a leakage current flowing into unselected word lines WL1 and WL3 to WLn of the selected bit line Sel BL. In addition, the memory device 100 may further include MTJ elements and cell transistors CT connected to the sub bit line Sub BL. The MTJ elements and the cell transistors CT connected to the sub bit line Sub BL may be referred to as "sub cells". However, unlike the selected bit line Sel BL and the reference bit line Ref BL, a gate electrode of each cell transistor CT connected to the sub bit line Sub BL may be connected with a ground terminal.

If a ratio of memory cells to be read to memory cells connected to the selected bit line Sel BL is relatively great, the leakage current $I_{LEAK}0$ may be smaller, and thus, an issue such as a decrease in the read margin may be less important. If a ratio of memory cells to be read among memory cells connected to the selected bit line Sel BL is relatively small, the leakage current $I_{LEAK}0$ may be greater, and thus, the read margin may decrease.

The leakage current $I_{LEAK}1$ may be generated by the sub bit line Sub BL and components connected to the sub bit line Sub BL implemented by some embodiments of the inventive concepts. Since the magnitude of a reference current Iref decreases due to the leakage current $I_{LEAK}1$, a voltage level of the second node N2 may decrease. Since a voltage level of the second node N2 decreases by the leakage current $L_{EAK}1$ in the sub bit line Sub BL at the same time when a voltage level of the first node N1 decreases by the leakage current $I_{LEAK}0$ in the selected bit line Sel BL, a voltage level difference between the first and second nodes N1 and N2 may be maintained without change. In this case, the sensing margin for the read operation may be secured, thereby preventing the read fail.

Figure 10:
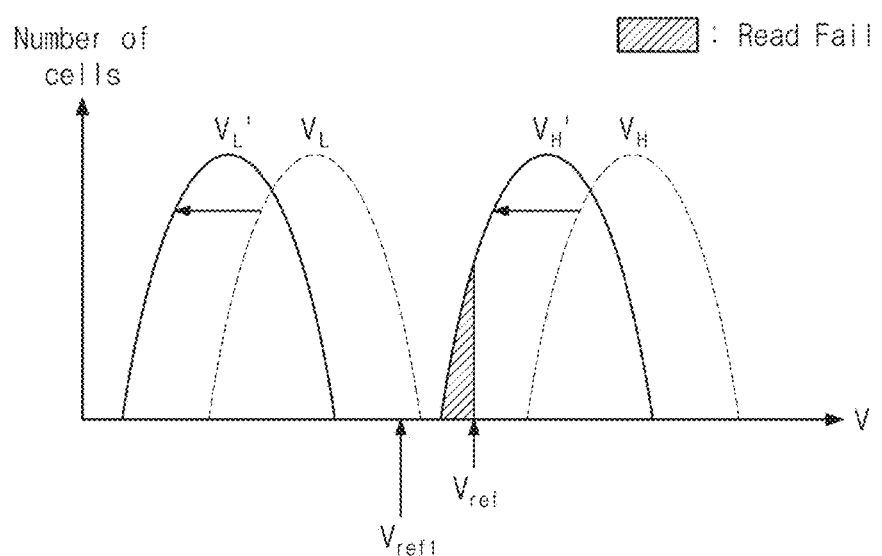
FIG. 10 is a graph illustrating a voltage distribution of magnetic tunnel junction (MTJ) elements of a memory device according to some embodiments of the inventive concepts.

FIG. 10 is a graph illustrating a voltage distribution of magnetic tunnel junction (MTJ) elements of a memory device according to some embodiments of the inventive concepts. To enable better understanding, a description will be given with reference to FIG. 9 together.

In general, MTJ elements may have a physical characteristic in which tunneling magnetoresistance (TMR) decreases while a resistance value of an anti-parallel state decreases as a temperature increases. Therefore, if a memory device operates at a high temperature, the read margin may decrease, and thus, the read fail may increase. That is, the read fail may further increase by a change in a distribution due to a high temperature in addition to a shift of the distribution due to a leakage current into the unselected word lines WL1 and WL3 to WLn of the selected bit line Sel BL. The shifted voltage distributions are marked in FIG. 10 by $V_L'$ and $V_H'$, respectively.

When a voltage distribution shifts due to an increase in a leakage current and/or a temperature, if a level of the reference voltage Vref (i.e., a voltage of the second node N2) is maintained without change, the read fail increases. However, the magnitude of a reference current Iref may decrease by connecting the sub bit line Sub BL to the second node N2, and thus, a level of the reference voltage Vref may decrease. A level of the decreased reference voltage is marked in FIG. 10 by Vref1. Since the reference voltage Vref1 is present between the shifted distribution of the low voltage state $V_L'$ and the shifted distribution of the high voltage state $V_H'$, the read fail may be prevented.

Figure 11:
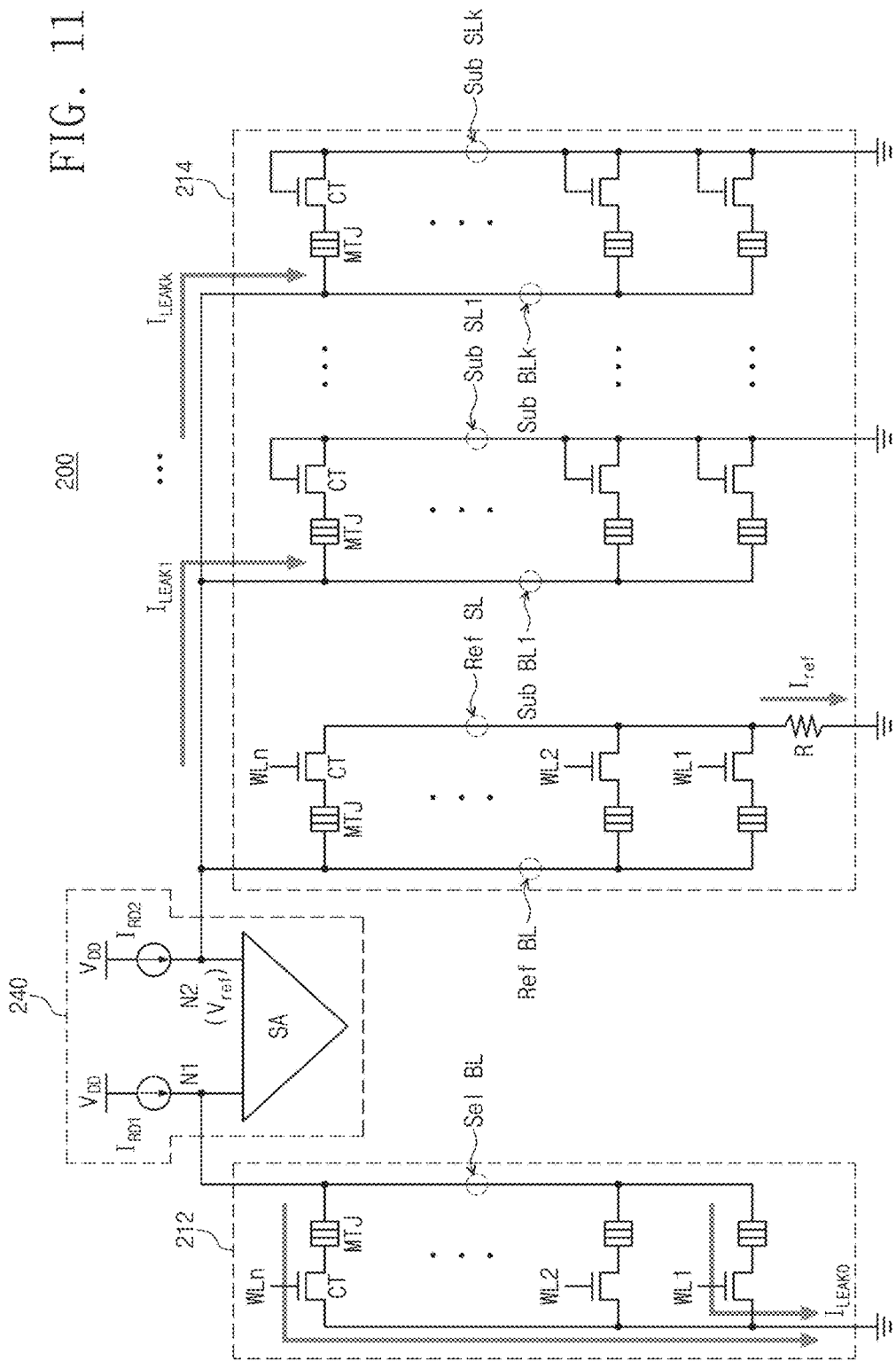
FIG. 11 is a schematic diagram illustrating a memory device according to some embodiments of the inventive concepts.

FIG. 11 is a schematic diagram illustrating a memory device according to some embodiments of the inventive concepts. It may be possible to prevent the read fail by securing the sensing margin through the embodiments described with reference to FIG. 9. However, if the number of memory cells connected to a selected bit line increases and most memory cells connected to the selected bit line are unselected memory cells, it may be insufficient to secure the sensing margin by using only one sub bit line Sub BL described with reference to FIG. 9. Some embodiments of the inventive concepts, such as the memory device 200 of FIG. 11, may not have the above-described issue.

The memory device 200 may include a first region 212 including the selected bit line Sel BL. The memory device 200 may include a second region 214 including the reference bit line Ref BL and a plurality of sub bit lines Sub BL1 to Sub BLk. The memory device 200 may include a read/write circuit 240.

If the amount of leakage current flowing into the selected bit line Sel BL is great, a voltage level of the first node N1 may sharply decrease. For the sense amplifier SA to perform a sensing operation normally, a level of a voltage (i.e., Vref) of the second node N2 may also decrease at the same time. In the device 200 of FIG. 11, leakage currents $I_{LEAK}1$ to $I_{LEAK}k$ may flow into the sub bit lines Sub BL1 to Sub BLk, respectively. Accordingly, since the magnitude of the reference current Iref becomes smaller, a level of the voltage Vref of the second node N2 may further decrease. Even though a voltage level of the first node N1 may sharply decrease, a voltage level difference between the first and second nodes N1 and N2 may be maintained without change, and thus, the read fail may be prevented.

Figure 12:
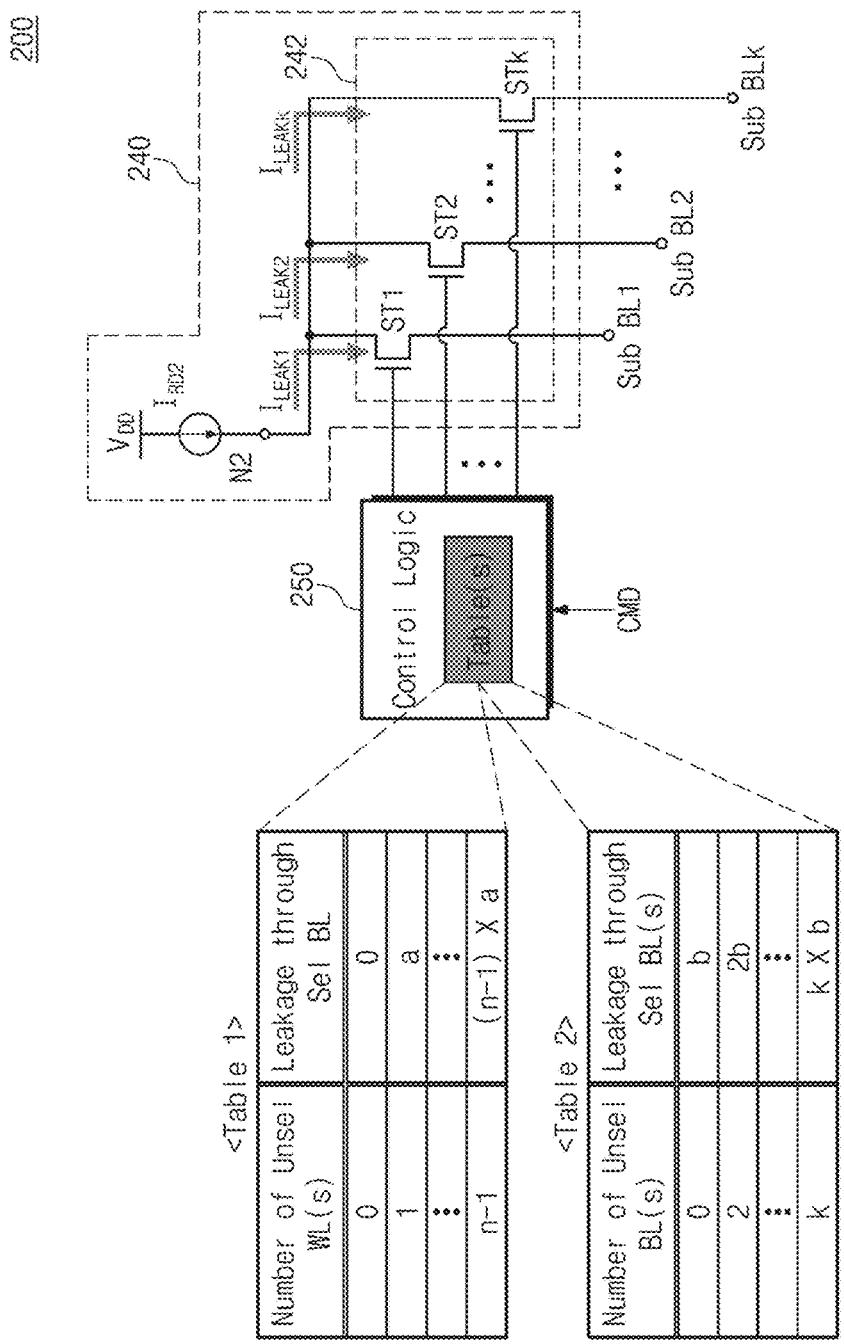
FIG. 12 is a diagram illustrating a memory device according to some embodiments of the inventive concepts.

FIG. 12 is a diagram illustrating a memory device according to some embodiments of the inventive concepts. How a plurality of sub bit lines of the memory device 200 of FIG. 11 are controlled will be described with reference to FIG. 12. To enable better understanding, a description will be given with reference to FIGS. 11 and 12.

The memory device 200 may include the read/write circuit 240 and control logic 250. The read/write circuit 240 may include a current source for generating the second read current $I_{RD2}$ and a selector 242. The memory device 200 may further include MTJ elements and cell transistors connected to the sub bit lines Sub BL1 to Sub BLk, a current source $I^{RD1}$ for generating the first read current, and the sense amplifier SA.

The control logic 250 may be configured to control the magnitude of a leakage current flowing into the sub bit lines Sub BL1 to Sub BLk. For example, the control logic 250 may control the magnitude of the leakage current in response to a command CMD. The command CMD may include, for example, a read command. The command CMD may be received from a host. Alternatively or additionally, the command CMD may be a command that is separately generated to control the magnitude of a leakage current. The command CMD may be generated by a controller for controlling the memory device 200 overall. However, embodiments of the inventive concepts are not limited thereto.

The control logic 250 may turn on or turn off selection transistors ST1 to STk respectively connected to the sub bit lines Sub BL1 to Sub BLk. If there is a need to increase the amount of leakage current flowing into the sub bit lines Sub BL1 to Sub BLk, the control logic 250 may increase the number of selection transistors to be turned on among the selection transistors ST1 to STk. In contrast, if there is a need to decrease the amount of leakage current flowing into the sub bit lines Sub BL1 to Sub BLk, the control logic 250 may decrease the number of selection transistors to be turned on among the selection transistors ST1 to STk.

The control logic 250 may control the selection transistors ST1 to STk by using one or more tables created in advance by a memory vendor. For example, the one or more tables may be stored in the first region 212 and may be loaded from the first region 212 during a read operation. Alternatively or additionally, the one or more tables may be stored in the control logic 250. However, embodiments of the inventive concepts are not limited thereto.

A first table, Table 1, may indicate a relationship between the number of unselected word lines of the selected bit line Sel BL and the leakage current $I_{LEAK}0$ into the unselected word lines. For example, if the number of unselected word lines of the selected bit line Sel BL is "0", the magnitude of the leakage current $I_{LEAK}0$ may be "0". As the number of unselected word lines of the selected bit line Sel BL increases, the magnitude of the leakage current $I_{LEAK}0$ may also increase.

A second table, Table 2, may indicate a relationship between the number of sub bit lines Sub BL1 to Sub BLk and leakage currents into the sub bit lines Sub BL1 to Sub BLk. For example, if only one selection transistor connected to a sub bit line of the sub bit lines Sub BL1 to Sub BLk is turned on, the amount "b" of leakage current may be smaller. In contrast, if all selection transistors connected to the sub bit lines Sub BL1 to Sub BLk are turned on, the amount "k×b" of leakage current may be greater. The amount "k×b" of leakage current may be a sum of leakage currents $I_{LEAK}1$ to $I_{LEAK}k$.

The control logic 250 may determine the optimal number of sub bit lines capable of securing the read margin in the read operation with reference to the first and second tables, Table 1 and Table 2. That is, the control logic 250 may appropriately turn on at least a part of the selection transistors ST1 to STk such that a leakage current corresponding to the leakage current $I_{LEAK}0$ flowing into the selected bit line Sel BL flows into sub bit lines.

Figure 13:
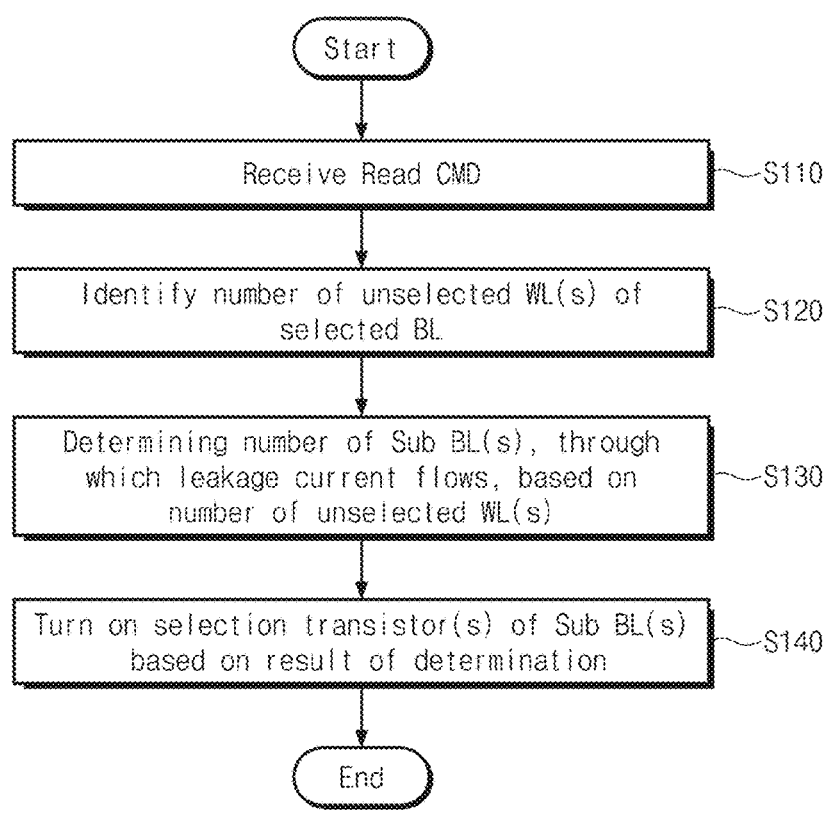
FIG. 13 is a flowchart illustrating operations of methods of operating a memory device according to some embodiments of the inventive concepts.

FIG. 13 is a flowchart illustrating operations of methods of operating a memory device according to some embodiments of the inventive concepts. For better understanding, a description will be given with reference to FIGS. 11 and 12.

In an operation S110, a read command may be received. An address of a memory cell from which data is to be read may be received together with the read command. The memory cell on which a read operation is to be performed may be specified or selected by a decoded address.

In an operation S120, the number of unselected word lines associated with a selected bit line Sel BL may be identified. As the number of unselected word lines increases, the magnitude of a leakage current into the selected bit line Sel BL may increase. As the number of unselected word lines decreases, the magnitude of a leakage current into the selected bit line Sel BL may decrease.

In an operation S130, the number of sub bit lines Sub BL for replicating a leakage current into the unselected word lines may be determined based on the number of unselected word lines. The control logic 250 may use one or more tables that are created in advance by a memory vendor. For example, as the number of unselected word lines increases, the number of sub bit lines each connected to a selection transistor to be turned on (or the number of sub bit lines through which a leakage current will flow) may increase. In contrast, as the number of unselected word lines decreases, the number of sub bit lines each connected to a selection transistor to be turned on (or the number of sub bit lines through which a leakage current will flow) may decrease.

In an operation S140, one or more of the sub bit lines Sub BL1 to Sub BLk may be turned on based on the determination result. Since a leakage current corresponding to a leakage current flowing into the selected bit line Sel BL flows through the one or more of the sub bit lines Sub BL1 to Sub BLk, the sensing margin for a read operation may be secured. As a result, the read fail may be prevented.

In the embodiments described with reference to FIGS. 11 to 13, the optimal number of sub bit lines through which a replicated leakage current flows may be determined by using a table created in advance. However, some embodiments of the inventive concepts may include a way to determine whether the sensing margin is secured as much as the read fail does not occur, while sequentially turning on selection transistors of the sub bit lines Sub BL1 to Sub BLk. This will be described with reference to FIGS. 14 and 15.

Figure 14:
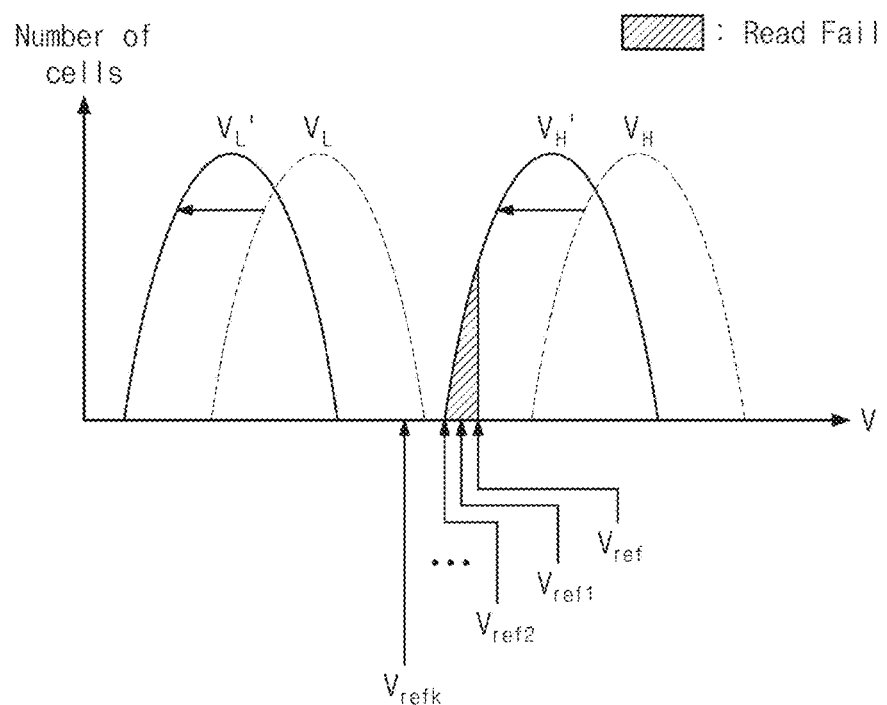
FIG. 14 is a graph illustrating a voltage distribution of magnetic tunnel junction (MTJ) elements of a memory device according to some embodiments of the inventive concepts.

FIG. 14 is a graph illustrating a voltage distribution of magnetic tunnel junction (MTJ) elements of a memory device according to some embodiments of the inventive concepts. To enable better understanding, a description will be given with reference to FIGS. 11, 12, and 14.

If the number of unselected word lines from among word lines associated with a selected bit line Sel BL increases, the amount of leakage current $I_{LEAK}0$ may increase. Accordingly, since a voltage level of the first node N1 decreases, a voltage distribution of FIG. 14 may be shifted to the left, or towards lower voltages. In addition, if the memory device 200 operates at a high temperature, TMR of the MTJ element may decrease, and thus, the voltage distribution may be further shifted to the left. The shifted voltage distributions are marked in FIG. 14 by $V_L'$ and $V_H'$, respectively.

The memory device 200 may check whether the read fail occurs, while increasing the number of sub bit lines through which a leakage current flows. For example, whether the read fail occurs may be checked by an error correction circuit provided in the memory device 200.

The memory device 200 may turn on a selection transistor of the first sub bit line Sub BL1. As the selection transistor of the first sub bit line Sub BL1 is turned on, the leakage current $I_{LEAK}1$ may be generated, and thus, a voltage (i.e., Vref) level of the second node N2 may decrease to Vref1. However, even though the voltage level of the second node N2 decreases to Vref1, a value of Vref1 may be still greater than a minimum value among voltage values that memory cells corresponding to the high voltage state $V_H$ may have. Therefore, the read fail may still occur.

The memory device 200 may additionally turn on a selection transistor of the second sub bit line Sub BL2. As the selection transistor of the second sub bit line Sub BL2 is turned on, the leakage current $I_{LEAK}1$ and $I_{LEAK}2$ may be generated, and thus, the voltage (i.e., Vref) level of the second node N2 may decrease to Vref2. However, even though the voltage level of the second node N2 decreases to Vref2, a value of Vref2 may be still greater than a minimum value among voltage values that memory cells corresponding to the high voltage state $V_H$ may have. Therefore, the read fail may still occur.

The memory device 200 may check whether the read fail occurs, while sequentially turning on selection transistors of the remaining sub bit lines. As a result, the read fail may not occur when the voltage level of the second node N2 reaches a specific value (e.g., Vref3 to Vrefk) smaller than Vref2.

Figure 15:
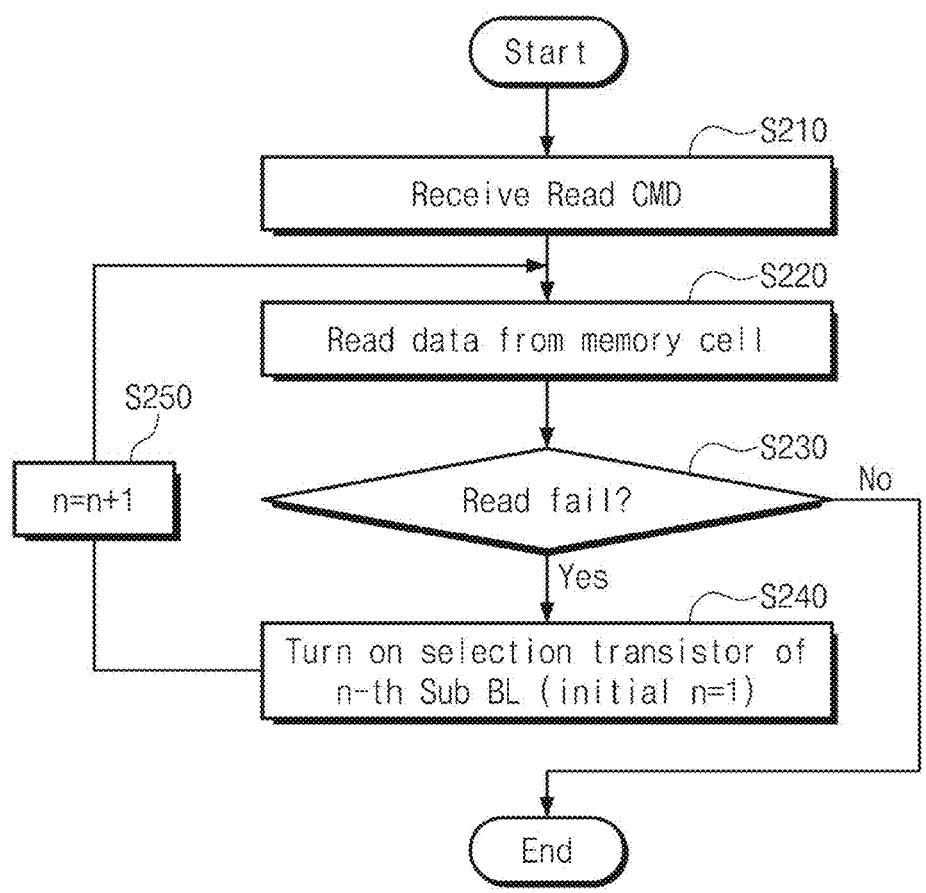
FIG. 15 is a flowchart illustrating operations of methods of operating a memory device according to some embodiments of the inventive concepts.

FIG. 15 is a flowchart illustrating operations of methods of operating a memory device according to some embodiments of the inventive concepts. FIG. 15 shows a read fail preventing scheme described with reference to FIG. 14.

In an operation S210, a read command may be received. An address of a memory cell from which data is to be read may be received together with the read command. A memory cell on which a read operation is to be performed may be specified or selected by an address. For example, the read fail preventing scheme of the inventive concepts may be executed in response to a read command. Alternatively or additionally, the read fail preventing scheme of the inventive concepts may be executed in response to a command that is different from the read command and is separately received.

In an operation S220, a read operation may be performed on a memory cell. Data of the memory cell may be read based on a voltage difference between a first node at which a selected bit line is connected to a sense amplifier and a second node at which a reference bit line is connected to the sense amplifier.

In an operation S230, whether the read fail occurs may be determined. The read fail may be determined in operation S230 based on a level of a reference voltage needed to perform a read operation not changing even though a voltage distribution of memory cells changes. Accordingly, it may be determined that the level of the reference voltage may need to be changed as the voltage distribution changes.

When the read fail does not occur, it may be determined that the sensing margin needed to perform the read operation is sufficiently secured. That is, when the read fail does not occur, it may be determined that a level of a reference voltage is present between a distribution of a high voltage region and a distribution of a low voltage region. Therefore, the process may end. In contrast, when the read fail occurs, an operation S240 may be performed.

In the operation S240, a selection transistor of a first sub bit line of a plurality of sub bit lines may be turned on. The plurality of sub bit lines may be connected to the second node at which the reference bit line is connected to the sense amplifier. As the selection transistor of the first sub bit line is turned on, a leakage current may be generated. Therefore, a level of the reference voltage may decrease.

In an operation S250, a next sub bit line may be considered. An equation "n=n+1" is exemplified in operation S250 as an additional leakage current into the second sub bit line Sub BL2 is generated after the leakage current into the first sub bit line Sub BL1 is generated.

Afterwards, the operations described with reference to operations S220 through operation S240 may be repeatedly performed until the read fail does not occur. The above-described process (or algorithm) may make it possible to determine a level of a reference voltage, at which the read fail does not occur, without the one or more separate tables described with reference to FIG. 12.

Figure 16:
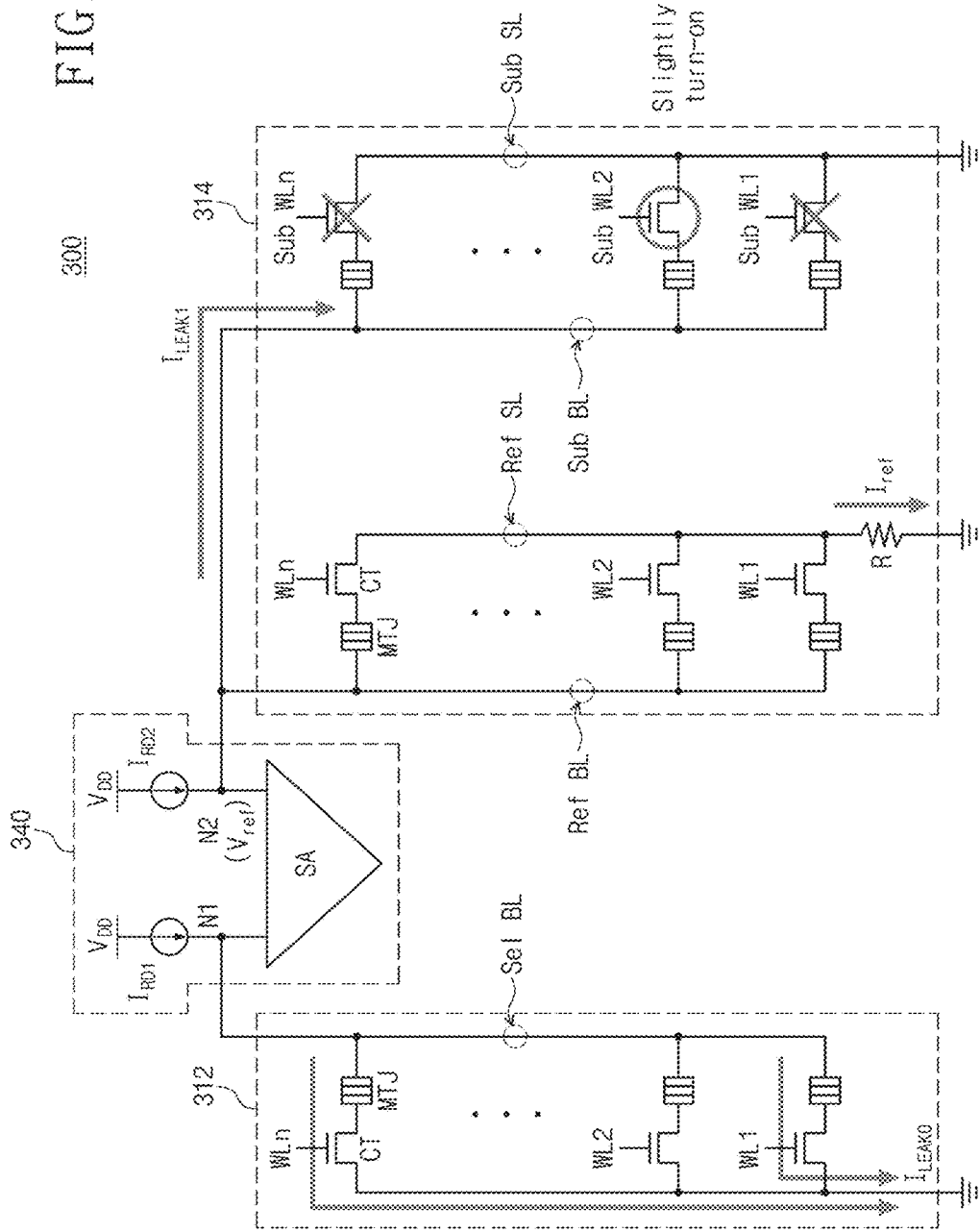
FIG. 16 is a schematic diagram illustrating a memory device according to some embodiments of the inventive concepts.

FIG. 16 is a schematic diagram illustrating a memory device according to some embodiments of the inventive concepts. A memory device 300 may include a first region 312, a second region 314, and a read/write circuit 340. The memory device 300 may be similar to one or more of the above-described memory devices, and a duplicated description may be thus omitted The second region 314 may include a reference bit line Ref BL and a sub bit line Sub BL. The arrangement and structure of the reference bit line Ref BL and the sub bit line Sub BL may be similar one or more of to the above-described embodiments. However, a connection relationship of cell transistors connected to the sub bit line Sub BL may be different from the above-described embodiments.

For example, gate electrodes of cell transistors connected to the sub bit line Sub BL may not be connected to a ground terminal. Instead, a level of a gate voltage to be applied to a cell transistor may be appropriately adjusted.

If a ground voltage is applied to the word lines Sub WL1 to Sub WLn connected to the cell transistors of the sub bit line Sub BL, the memory device 200 of FIG. 16 may be substantially the same as the memory device 100 of FIG. 9. However, in the memory device 200, appropriate gate biasing may be performed to adjust the magnitude of the leakage current.

For example, the occurrence of a read fail when a ground voltage is applied to the word lines Sub WL1 to Sub WLn connected to the cell transistors of the sub bit line Sub BL may indicate that the magnitude of the leakage current $I_{LEAK}1$ is small and that a level of the reference voltage Vref has not decreased sufficiently.

The memory device 300 may be configured to perform gate biasing on the cell transistors of the sub bit line Sub BL for the purpose of decreasing a level of the reference voltage Vref. For example, the memory device 300 may further include a voltage controller that controls a gate voltage to be applied to a gate electrode of a cell transistor. The voltage controller may weakly turn on a cell transistor connected to the second word line Sub WL2 to increase the magnitude of the leakage current $I_{LEAK}1$. Since the magnitude of the leakage current $I_{LEAK}1$ increases, the magnitude of the reference current Iref may decrease. Accordingly, a level of the reference voltage Vref may decrease.

However, when a level of the reference voltage Vref does not decrease sufficiently even though the cell transistor connected to the second word line Sub WL2 of the sub bit line Sub BL is slightly turned on, the read fail may occur. Accordingly, the memory device 300 may perform gate biasing such that the magnitude of the leakage current $I_{LEAK}1$ increases. For example, the memory device 300 may increase a level of a gate voltage to be applied to the second word line Sub WL2. Alternatively or additionally, the memory device 300 may perform gate biasing on cell transistors connected to the remaining word lines Sub WL1 and Sub WL3 to Sub WLn to further increase the magnitude of the leakage current $I_{LEAK}1$. Since the magnitude of the leakage current $I_{LEAK}1$ increases through the additional gate biasing, a level of the reference voltage Vref may decrease.

Figure 17:
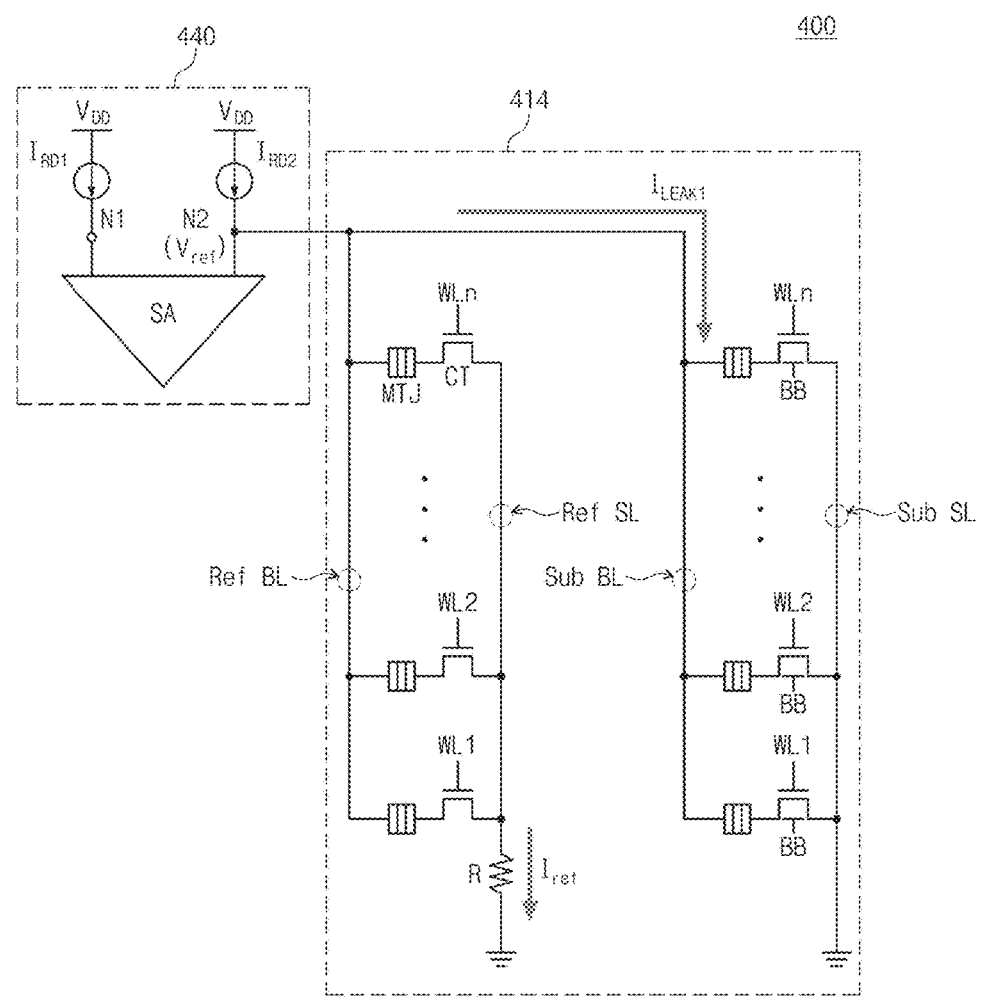
FIG. 17 is a schematic diagram illustrating a memory device according to some embodiments of the inventive concepts.

FIG. 17 is a schematic diagram illustrating a memory device according to some embodiments of the inventive concepts. A memory device 400 may include a second region 414 and a read/write circuit 440. The memory device 400 may further include a selected bit line connected to a first node similar to one or more of the above-described embodiments.

The second region 414 may include a reference bit line Ref BL and a sub bit line Sub BL. The arrangement and structure of the reference bit line Ref BL and the sub bit line Sub BL may be similar to one or more of the above-described embodiments. However, a structure of cell transistors connected to the sub bit line Sub BL may be different from the above-described embodiments.

For example, cell transistors connected to the sub bit line Sub BL may be manufactured such that body biasing is performed. For example, the memory device 400 may include a voltage controller for performing body biasing. The body biasing may result from applying a specific voltage or current to a substrate or a well region, in which a cell transistor is manufactured, for the purpose of easily adjusting a level of a threshold voltage of a cell transistor.

For example, cell transistors connected to the sub bit line Sub BL may be formed on a separate well region unlike other bit lines (e.g., a selected bit line and a reference bit line). Alternatively or additionally, cell transistors connected to the sub bit line Sub BL may be isolated by an isolation layer formed by a shallow trench isolation (STI) process to prevent the body biasing associated with the cell transistors connected to the sub bit line Sub BL from having an influence on other cell transistors.

Figure 18:
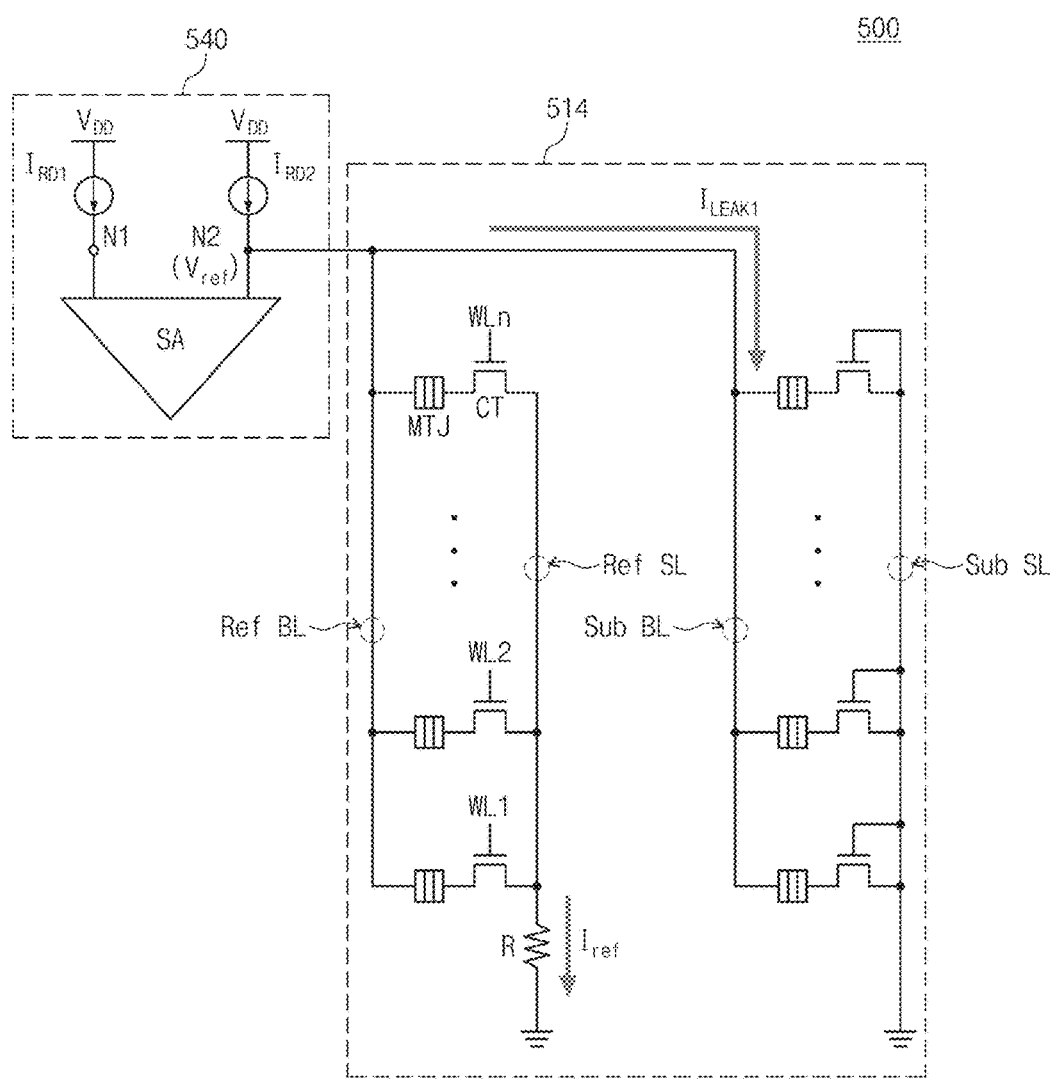
FIG. 18 is a schematic diagram illustrating a memory device according to some embodiments of the inventive concepts.

FIG. 18 is a schematic diagram illustrating a memory device according to some embodiments of the inventive concepts. A memory device 500 may include a second region 514 and a read/write circuit 540. The memory device 500 may include a selected bit line connected to a first node similar to one or more of the above-described embodiments.

The memory device 500 may be similar to the memory device 100 described with reference to FIG. 9. However, a sub source line Sub SL may be connected to a second power supply voltage $V_{SS}$, not a ground terminal.

The magnitude of the leakage current may be adjusted by changing a level of the second power supply voltage $V_{SS}$. For example, if the second power supply voltage $V_{SS}$ has a negative value, a level of the reference voltage Vref may decrease. In contrast, if the second power supply voltage $V_{SS}$ has a positive value, a level of the reference voltage Vref may increase.

In addition to the above-described embodiments, the number of memory cells connected to the sub bit line Sub BL or the sub bit lines Sub BL1 to Sub BLk may be adjusted in a manufacturing process. For example, to adjust the amount of leakage current flowing into a sub bit line, the number of MTJ elements and/or cell transistors of the sub bit line may be adjusted.

Alternatively or additionally, in addition to the above-described embodiments, the size of cell transistors connected to the sub bit line Sub BL or the sub bit lines Sub BL1 to Sub BLk may be adjusted in a manufacturing process. For example, to adjust the amount of leakage current flowing into a sub bit line, the size of the cell transistor of the sub bit line may be increased or decreased.

Alternatively or additionally, in addition to the above-described embodiments, a via may be formed in at least a part of MTJ elements connected to the sub bit line Sub BL or the sub bit lines Sub BL1 to Sub BLk. A sub bit line and a sub source line may be connected to each other through the via. If the sub bit line and the sub source line are directly connected to each other through the via, the amount of leakage current may increase.

According to the above-described embodiments, it may be possible to efficiently adjust a level of a reference voltage used to determine read data by providing at least one sub bit line. It may be possible to efficiently prevent a read fail by connecting a sub bit line to a sense amplifier in a manufacturing process, without using a separate complicated algorithm.

According to some embodiments of the inventive concepts, it may be possible to prevent read failure due to a leakage current into a bit line by additionally implementing a sub bit line and a reference bit line.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the inventive concepts have been described with reference to some embodiments, it will be apparent to those skilled in the art that various changes and modifications may be made without departing from the spirit and scope of the inventive concepts. Therefore, it should be understood that the above embodiments are not limiting, but illustrative.

What is claimed is:

1. A memory device comprising:
a selected bit line connected to a first node and configured to receive a first current;
a selected memory cell connected to the selected bit line;
a reference bit line connected to a second node and configured to receive a second current;
a reference memory cell connected between the reference bit line and a reference source line;
a sub bit line connected to the second node;
a sub memory cell connected between the sub bit line and a sub source line; and
a sense amplifier configured to sense a voltage difference between the first node and the second node to determine data read from the selected memory cell connected to the selected bit line,
wherein the sub memory cell comprises a cell transistor of which a gate electrode is connected to the sub source line.

2. The memory device of claim 1,
wherein the sub memory cell further comprises a magnetic tunnel junction element, a first end of which is connected to the sub bit line, and
wherein a first end of the cell transistor is connected to a second end of the magnetic tunnel junction element and a second end of the cell transistor is connected to the sub source line.

3. The memory device of claim 2,
wherein the sub source line is connected to a ground voltage.

4. The memory device of claim 2, wherein the magnetic tunnel junction element comprises:
a free layer, a magnetization direction of which is configured to vary depending on the second current; and
a pinned layer, a magnetization direction of which is pinned regardless of the second current.

5. The memory device of claim 4,
wherein the magnetic tunnel junction element further comprises a via passing through the free layer and the pinned layer, and
wherein the sub bit line and the sub source line are connected to each other through the via.

6. The memory device of claim 1, further comprising:
a voltage controller configured to control a voltage and to apply the voltage to the gate electrode of the cell transistor.

7. The memory device of claim 1, further comprising:
a voltage controller configured to perform body biasing on a substrate or a well region where the cell transistor is formed.

8. The memory device of claim 1,
wherein the first current and the second current are generated based on a first power supply voltage,
wherein the sub source line is connected to a second power supply voltage.

9. The memory device of claim 8, wherein the memory device further comprises a voltage controller configured to vary the second power supply voltage.

10. The memory device of claim 1, further comprising:
one or more unselected memory cells connected to the selected bit line,
wherein a first leakage current flowing into the one or more unselected memory cells corresponds to a second leakage current flowing into the sub bit line.

11. A memory device comprising:
a memory cell array including a selected memory cell connected to a selected bit line, a reference cell connected to a reference bit line, and a sub cell connected to a sub bit line; and
a sense amplifier configured to sense a voltage difference between a first node through which a first current is input to the reference bit line and a second node through which a second current is input to the reference bit line and the sub bit line,
wherein the sub cell includes:
a magnetic tunnel junction element, a first end of which is connected to the sub bit line; and
a cell transistor having a first end connected to a second end of the magnetic tunnel junction element, a second end connected to a sub source line, and a gate electrode connected to the sub source line.

12. The memory device of claim 11, wherein the magnetic tunnel junction element comprises:
a free layer, a magnetization direction of which is configured to vary depending on the second current; and
a pinned layer, a magnetization direction of which is pinned regardless of the second current.

13. The memory device of claim 12,
wherein the magnetic tunnel junction element further comprises a via passing through the free layer and the pinned layer, and
wherein the sub bit line and the sub source line are connected to each other through the via.

14. The memory device of claim 11, further comprising:
a voltage controller configured to control a voltage and to apply the voltage to the sub source line.

15. The memory device of claim 11, further comprising:
a voltage controller configured to perform body biasing on a substrate or a well region where the cell transistor is formed.

16. A memory device comprising:
a memory cell array including a selected memory cell connected to a selected bit line, a reference cell connected to a reference bit line, a first sub cell connected to a first sub bit line, and a second sub cell connected to a second sub bit line;
a sense amplifier configured to sense a voltage difference between a first node through which a first current is input to the reference bit line and a second node through which a second current is input to the reference bit line, the first sub bit line, and the second sub bit line; and
control logic configured to selectively connect the first sub bit line and the second sub bit line to the second node.

17. The memory device of claim 16, wherein the first sub cell comprises:

a magnetic tunnel junction element, a first end of which is connected to the first sub bit line; and a cell transistor having a first end connected to a second end of the magnetic tunnel junction element and a second end connected to a first sub source line.

18. The memory device of claim 16, further comprising:
a read/write circuit configured to determine read data from the selected memory cell based on a sensing result of the sense amplifier.

19. The memory device of claim 18, further comprising:
a first selection transistor configured to connect the first sub bit line to the second node; and
a second selection transistor configured to connect the second sub bit line to the second node,
wherein the control logic is configured to control the first selection transistor and the second selection transistor.

20. The memory device of claim 18, further comprising:
an error correction circuit configured to detect an error of the read data determined by the read/write circuit,
wherein the control logic is configured to connect the second sub bit line to the second node based on a detection result of the error correction circuit.

* * * * *